(12) United States Patent
Lin et al.

(10) Patent No.: US 9,312,356 B1
(45) Date of Patent: Apr. 12, 2016

(54) SEMICONDUCTOR DEVICE AND MANUFACTURING METHOD THEREOF

(71) Applicant: UNITED MICROELECTRONICS CORP., Hsin-Chu (TW)

(72) Inventors: Ching-Ling Lin, Kaohsiung (TW); Chih-Sen Huang, Tainan (TW); Yi-Wen Chen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/613,379

(22) Filed: Feb. 4, 2015

(30) Foreign Application Priority Data

Jan. 5, 2015 (CN) .......................... 2015 1 0001982

(51) Int. Cl.
*H01L 21/70* (2006.01)
*H01L 29/49* (2006.01)
*H01L 21/02* (2006.01)
*H01L 21/768* (2006.01)
*H01L 21/311* (2006.01)
*H01L 21/28* (2006.01)

(52) U.S. Cl.
CPC ...... *H01L 29/4966* (2013.01); *H01L 21/02244* (2013.01); *H01L 21/28088* (2013.01); *H01L 21/31144* (2013.01); *H01L 21/76805* (2013.01)

(58) Field of Classification Search
CPC .................... H01L 29/4966; H01L 21/02244; H01L 21/28079; H01L 21/28247; H01L 21/31144; H01L 21/76805
USPC ........................................................ 257/407
See application file for complete search history.

(56) References Cited

U.S. PATENT DOCUMENTS

| 6,797,556 | B2 * | 9/2004 | Murthy ............. H01L 21/28052 257/288 |
| 8,802,560 | B1 | 8/2014 | Lu |
| 2015/0008527 | A1 | 1/2015 | Yang |

OTHER PUBLICATIONS

Lin, Title of Invention: Method of fabricating metal gate structure, U.S. Appl. No. 14/463,677, filed Aug. 20, 2014.

\* cited by examiner

*Primary Examiner* — Tu-Tu Ho
(74) *Attorney, Agent, or Firm* — Winston Hsu; Scott Margo

(57) ABSTRACT

The semiconductor device includes a gate electrode, a first interlayer dielectric, a first mask layer, a second mask layer and a second interlayer dielectric. The first interlayer dielectric surrounds the periphery of the gate electrode, and the first mask layer is disposed on the gate electrode. The first mask layer and the gate electrode have at least one same metal component. The second mask layer is disposed on the sidewalls of the first mask layer, and the second interlayer dielectric is disposed on the second mask layer and in direct contact with the first interlayer dielectric.

18 Claims, 5 Drawing Sheets

SEMICONDUCTOR DEVICE AND MANUFACTURING METHOD THEREOF

BACKGROUND OF THE INVENTION

1. Field of the Invention

The present invention relates generally to the field of semiconductor devices, and more particularly to a semiconductor device with raised source/drain regions and a metal gate and to a fabrication method thereof.

2. Description of the Prior Art

Along with the continuous miniaturization of the Integrated Circuits (IC), the feature size of each semiconductor device within the ICs also shrinks continuously. In order to overcome electrical or processing limitations arising from the miniaturization of semiconductor devices, semiconductor manufacturers have found out several solutions. For example, for a transistor device with a polysilicon gate, some disadvantages, such as boron penetration and depletion effect often occur and cause inferior performance of the transistor device. In order to solve these drawbacks, some semiconductor manufacturers adopt a gate-last process to replace the conventional polysilicon gate with a metal gate having metal electrode. Additionally, along with the shrinkage between two adjacent gate structures, semiconductor manufacturers also correspondingly invent a method for self-aligning a contact structure so as to overcome drawbacks due to the insufficient space between the two adjacent gate structures.

For a transistor device having both a metal gate and a self-aligned contact structure, a mask layer is often formed to cover the metal gate prior to the formation of the self-aligned contact structure. In the case where the gate electrode is covered by the mask layer, even though the self-aligned contact structure is formed close to the metal gate, there is still no unnecessary contact between them.

However, the processes for fabricating the transistor device having the metal gate and the self-aligned contact structure incur other drawbacks. Since steps for forming the mask layer often include removing an upper portion of the metal gate to leave a trench and filling up the trench with the mask layer, these steps often inevitably reduce the height of the metal gate. It is known that the electrical property of a transistor device is strongly related to the height of a metal gate. In order to maintain the height of the final metal gate within a predetermined value, semiconductor manufacturers often increase the height of an initial dummy gate. However, this solution results in other unwanted problems, such as the tendency of the dummy gate to break during a polishing process, the intense shadowing effect arising from the dummy gate during an ion implantation process, the difficulty to fill up the space between two adjacent dummy gates with a dielectric layer and to fill a metal layer into a gate trench. Furthermore, since a planarization process is carried out during a process for forming the mask layer, a dishing phenomenon generally occurs on a surface of the relatively large-sized mask layer.

Accordingly, there is still a need to provide a modified semiconductor device and a fabrication method thereof in order to overcome the above-mentioned drawbacks.

SUMMARY OF THE INVENTION

The semiconductor device is provided according to one embodiment of the present invention. The semiconductor device includes a gate electrode, a first interlayer dielectric, a first mask layer, a second mask layer and a second interlayer dielectric. The first interlayer dielectric surrounds the periphery of the gate electrode, and the first mask layer is disposed on the gate electrode. The first mask layer and the gate electrode have at least one same metal component. The second mask layer is disposed on the sidewalls of the first mask layer, and the second interlayer dielectric is disposed on the second mask layer and in direct contact with the first interlayer dielectric.

The method for fabricating semiconductor device is provided according to another embodiment of the present invention and includes the following steps: forming a gate electrode on a substrate so that the gate electrode is surrounded by a first interlayer dielectric; oxidizing top portions of the gate electrode so as to form a first mask layer; conformally depositing a dielectric layer which covers the first mask layer and the first interlayer dielectric; etching the dielectric layer so as to form a second mask layer and expose portions of the first mask layer are from the second mask layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
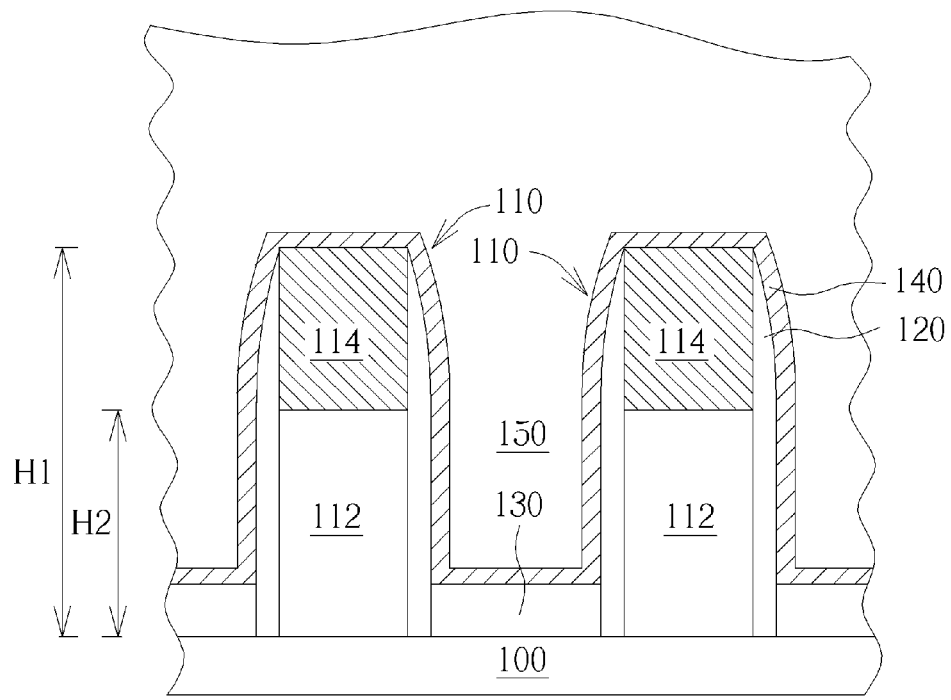
FIG. 1 to FIG. 9 are schematic cross-sectional diagrams showing a method for fabricating a semiconductor device according to preferred embodiments of the present invention.

FIG. 1 to FIG. 7 are schematic cross-sectional diagrams showing a method for fabricating a semiconductor device according to a first preferred embodiment of the present invention. FIG. 1 is a schematic diagram showing a semiconductor device at the beginning of the fabrication process. As shown in FIG. 1, a substrate having stack structures, spacers, epitaxial layers, doped regions, cap layers and dielectric layers disposed thereon or therein is provided. For example, the substrate 100 may be a semiconductor substrate with several optional protruding fin structures on its surface, but not limited thereto. The stack structures may be dummy gate structures 110 and each of dummy gate structure 110 may include an interfacial layer (not shown), a sacrificial layer 112 and a cap layer 114 stacked from bottom to top. The spacers may be gate spacers 120 respectively disposed on the sidewalls of each of the dummy gate structures 110. The epitaxial layers 130 are disposed inside or outside the substrate 100 and are respectively disposed on each side of the dummy gate structure 110, but not limited thereto. The doped regions (not shown) may be, for example, lightly-doped drains (LDD) and/or source/drain regions and are respectively disposed on each side of each dummy gate structure 110. Besides, the doped regions may be optionally located in the substrate 100 or the epitaxial layers 130, but not limited thereto. The cap layer and the dielectric layer may respectively correspond to an etch stop layer 140 and a first interlayer dielectric 150 and are sequentially stacked on the substrate 100. Additionally, the etch stop layer 140 may conformally cover the gate spacers 120, the epitaxial layers 130 and the cap layer 114.

The above-mentioned substrate 100 may be selected from a silicon substrate, a silicon-germanium substrate or a silicon-on-insulator (SOI) substrate, but not limited thereto. In a case where the surface of the substrate 100 has protruding fin structures, the bottom of each dummy gate structure 110 may surround a section of the corresponding protruding fin structure. The interfacial layer (not shown), the sacrificial layer 112 and the cap layer 114 in each dummy gate structure 110 may respectively correspond to an oxide layer, a silicon layer and a nitride layer, for example a silicon oxide layer, a polysilicon layer and a silicon nitride layer, but not limited thereto. The gate spacers 120 may be selected from a silicon nitride, a silicon carbide, a silicon carbon nitride, a silicon oxynitride or other suitable semiconductor compounds. The epitaxial layers 130 disposed at two sides of the dummy gate structures 110 may be selected from doped or un-doped semiconductor materials, such as silicon germanium, silicon phosphor, silicon carbon or the like. The epitaxial layers 130 may impose required stress on channel regions of the semiconductor device and accordingly improve the carrier mobility in the channel regions. The etch stop layer 140 may be selected from a silicon carbon nitride, a silicon oxynitride, a silicon nitride, a silicon carbide or other suitable semiconductor compounds. The etch stop layer 140 may also impose required stress on the channel regions and/or act as an etch stop layer during a subsequent process for forming a contact structure. The first interlayer dielectric 150 may be selected from non-conductive dielectric materials, such as silicon oxide or the like.

At this stage, there is a first height H1 between the top surface of each cap layer 114 and that of the substrate 100, while there is a second height H2 between the top surface of the sacrificial layer 112 and that of substrate 100. The first height H1 approximately ranges from 1000 Angstroms to 2000 Angstroms and preferably is 1300 Angstroms, and the second height H2 approximately ranges from 700 Angstroms to 1200 Angstroms and preferably is 900 Angstroms.

Then, a polishing process and/or an etching process is carried out, such as a chemical mechanical polishing process, to remove the cap layer 114 completely until the exposure of the top surface of the sacrificial layers 112. In this process, since a portion of the sacrificial layer 112 in each dummy gate structure 110 may be removed, a distance between the top surface of each sacrificial layer 112 and that of the substrate 100 may be slightly reduced.

Figure 2:
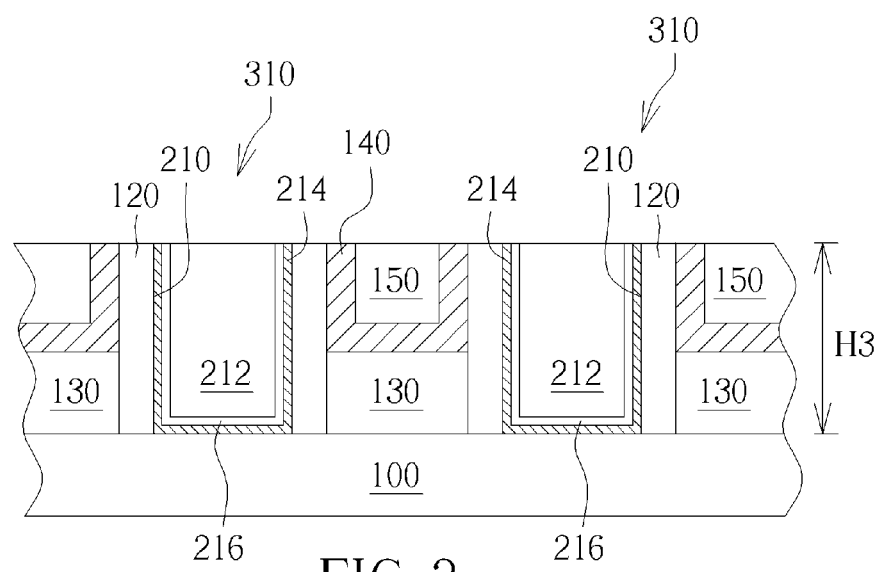

A replacement metal gate (RMG) process may be then carried out after the above-mentioned polishing process and/or etching process is completed. The corresponding structure of the semiconductor device is shown in FIG. 2. Specifically, the RMG process may include the following steps. First, the sacrificial layer 112 within each dummy gate structure 110 is removed in order to leave a trench 210. Then, a dielectric layer 214, a work function metal layer 216 and a conductive layer (not shown) is sequentially filled into the trench 210. Afterwards, a polishing process is carried out to remove the dielectric layer 214, the work function metal layer (216) and the conductive layer outside the trench 210 until the interlayer dielectric layer 150 is exposed. In this way, several metal gate structures 310 are obtained, and a conductive layer in each trench 210 may act as a gate electrode 212 of the metal gate structures 310.

At this stage, the top surface of the gate electrode 212 is preferably substantially level with that of the first interlayer dielectric 150. Besides, there is a third height H3 between the top surface of the gate electrode 212 and that of the substrate 100. Since the above-mentioned polishing process may not only remove the conductive layers, but also remove a portion of the gate spacers 120, the etch stop layer 140 and the first interlayer dielectric 150, the third height H3 may be therefore slightly lower than the second height H2. Specifically, the difference between them may range from 50 Angstroms to 300 Angstroms, preferably is 150 Angstroms. In addition, the top surface of each gate electrode 212 may be slightly lower than that of the gate spacers 120, the etch stop layer 140 and the first interlayer dielectric 150, but not limited thereto.

The dielectric layer 214 is preferably a high-k dielectric layer with a dielectric constant substantially greater than 20. As an example, the dielectric layer 214 could be selected from the group consisting of hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), but not limited thereto. Additionally, the work function metal layers include titanium nitride (TiN), titanium carbide, (TiC), tantalum nitride (TaN), tantalum carbide (TaC), tungsten carbide (WC) or aluminum titanium nitride (TiAlN), but not limited thereto. The gate electrodes 152 may include metal or metal oxide with superior filling ability and relative low resistance, such as aluminum (Al), titanium aluminum (TiAl), titanium aluminum oxide (TiAlO), tungsten (W) or copper (Cu), but not limited thereto.

Additionally, since the above-mentioned process is a gate-last process accompanied with a high-k last process, both the dielectric layer 214 and the work function metal layer are preferably disposed on the sidewalls and the bottom of each trench 210. However, the present embodiment is not limited thereto. In other words, a gate-first process accompanied with a high-k first process may be applied instead. In this way, prior to the removal of the sacrificial layer, the substrate 100 within the trench 210 may be covered by the high-k dielectric layer. In addition, a barrier layer (not shown) may be optionally formed and may cover the high-k dielectric layer so that the high-k dielectric layer is not removed along with the sacrificial layer. The barrier layer may be a metal layer, such as a titanium nitride layer.

Figure 3:
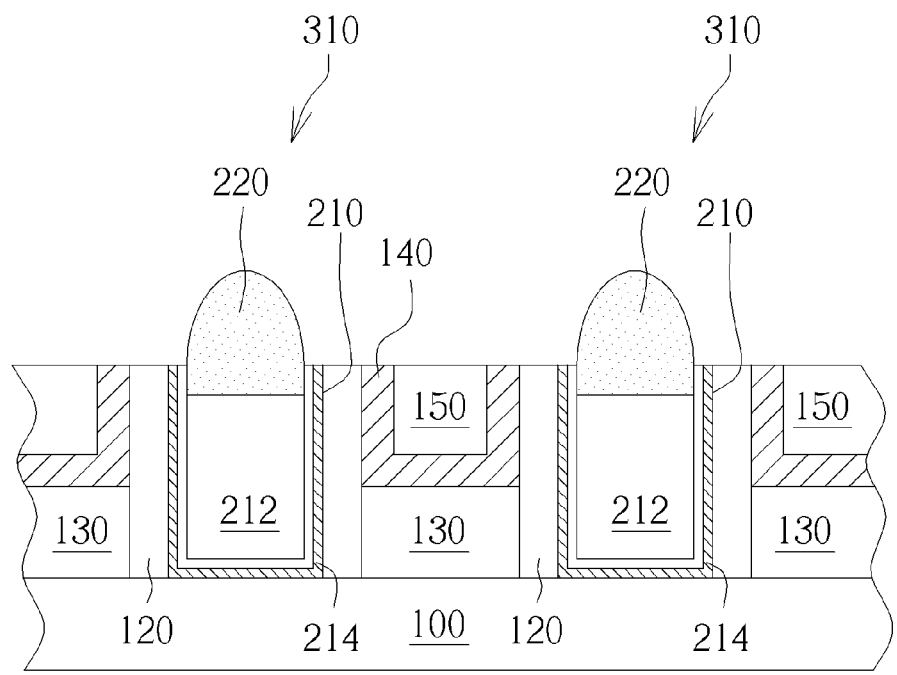

FIG. 3 is a schematic diagram showing a semiconductor device after the formation of a mask layer according to a first preferred embodiment of the present invention. The top portions of the gate electrodes 212 within the trenches 210 are then oxidized or nitrided through an oxidation or a nitridation process. Therefore, a first mask layer 220 with relatively high resistance may be formed in the top portions of each gate electrodes 212. Preferably, the first mask layer 220 has a convex surface and may cover the underneath metal electrode 212 completely. In this way, the top surface of the gate electrode 212 may be fully protected by the first mask layer 220 without being in direct contact with the outer environment.

Furthermore, because the first mask layer 220 is generated by oxidizing or nitriding the gate electrode 212, there is relevance between the compositions of these two structures. Specifically, a metal component of the first mask layer 220 must be the same as at least one of the metal components of the gate electrode 212. For example, when the metal electrode 212 is mainly made of tungsten, the corresponding first mask layer 220 is made of either tungsten oxide or tungsten nitride. Similarly, when the metal electrode 212 is mainly made of aluminum, the corresponding first mask layer 220 is made of either aluminum oxide or aluminum nitride, but not limited thereto.

Figure 4:
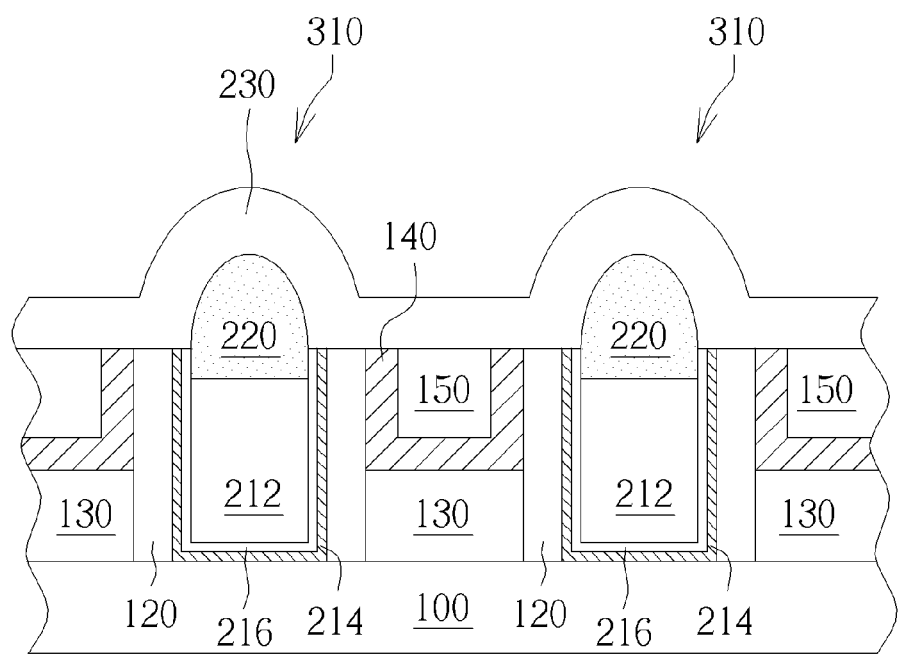

FIG. 4 is a schematic diagram showing a semiconductor device after depositing a dielectric layer. A deposition process, such as a physical vapor deposition process, a chemical vapor deposition process or an atomic layer deposition process, may be carried out to form a conformal dielectric layer 230 on the first mask layers 220. The dielectric layer 230 may completely cover the gate electrodes 212, the gate spacers 120, the etch stop layers 140, the first interlayer dielectric 150 and the first mask layers 220. The composition of the dielectric layer 230 may include a silicon carbon nitride, a silicon oxynitride, a silicon nitride or a silicon carbide that is different from that of the first interlayer dielectric layer 150. In this way, a required etching selectivity is defined among these layers, but not limited thereto.

Figure 5:
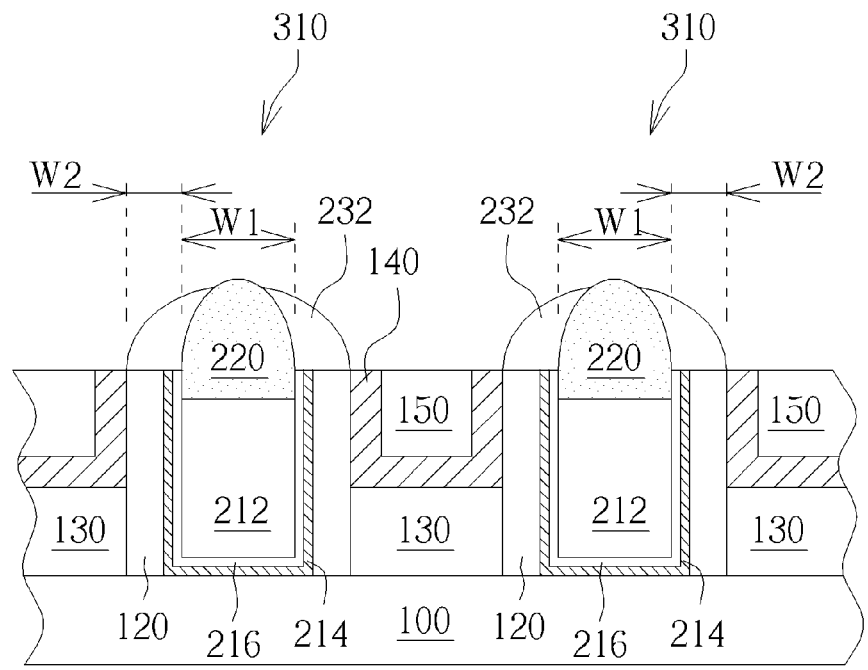

FIG. 5 is a schematic diagram showing a semiconductor device with second mask layers according to a first preferred of the present invention. After the deposition of the dielectric layer 230, the dielectric layer 230 is then etched until the underneath interlayer dielectric layer 150 and the top surface of the first mask layer 220 are exposed. Therefore, second mask layers 232 may be formed on two sides of the first mask layer 220. Preferably, each first mask layer 220 may have a first width W1 equal to the width of the gate electrode 212. That is to say, the first width W1 is narrower than the critical dimension of the sacrificial layer 112 of the corresponding dummy gate structure 110. Furthermore, each second mask layer 232 may have a second width W2 less than the first width W1 of the first mask layers 220. One feature of the present embodiment is that each first mask layer 220 along with the second mask layers 232 on its two sidewalls is able to completely cover the underneath corresponding gate electrode 212, the dielectric layer 214 and the work function metal layer 216, and may further cover the underneath etch stop layers 140 and the first interlayer dielectric 150. In other words, the total width of each first mask layer 220 along with the second mask layers 232 on its two sidewalls is greater than that of the underneath gate electrode 212.

Figure 6:
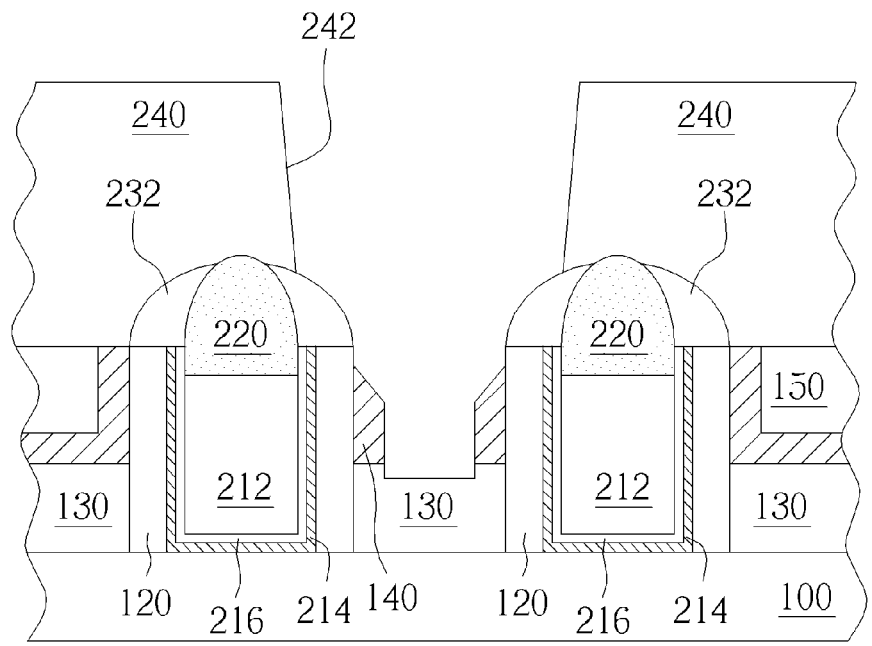

FIG. 6 is a schematic diagram showing a semiconductor device with a contact hole. After the formation of the first mask layer 220 and the second mask layers 232, a second interlayer dielectric 240, such as a pre-metal dielectric (PMD), may be deposited blankly to completely cover the first mask layers 220, the second mask layers 232 and the first interlayer dielectric 150. Then, a photolithographic process and an etching process are carried out sequentially to form a contact hole 242 in the second interlayer dielectric 240 and the first interlayer dielectric 150. Therefore, the epitaxial layers 130 or the substrate 100 between the gate electrodes 212 may be exposed from the contact hole 242.

It should be noted that, during the process for forming the contact hole 242, the etching rate of the first mask layers 220 and the second mask layer 232 is lower than the etching rate of the second interlayer dielectric 240 and the first interlayer dielectric 150. In this way, the first mask layer 220 and the second mask 232 may only be removed slightly during the etching process, and therefore they can be used to protect underneath gate electrodes 212 and work function metal layer 216 from etching. In addition, because the first mask layer 220 and the second mask layer 232 are made of metal compounds or dielectric with relatively high resistance, they can be used to prevent the underneath gate electrode 212 and work function metal layer 216 from electrically connecting to the subsequently formed self-aligned contact structure. Furthermore, based on various etchants and etching recipes, portions of the second mask layer 232 may be removed during the etching process, which causes the first mask layer 220 to be exposed from the contact hole 242.

The composition of the second interlayer dielectric 240 may be similar to that of the first interlayer dielectric 150, such as a silicon oxide, so that there is the same or similar etching rate between them. Accordingly, even though a misalignment occurs during the photolithographic process, the contact hole 242 may only expose the epitaxial layer 130 or the substrate 100 rather than the gate electrodes 212. The etchants described above may be chosen from suitable gas etchants, such as $C_4F_6$, $C_5F_8$, $O_2$, Ar, CO, $CH_2F_2$ or the mixture thereof, but not limited thereto.

Figure 7:
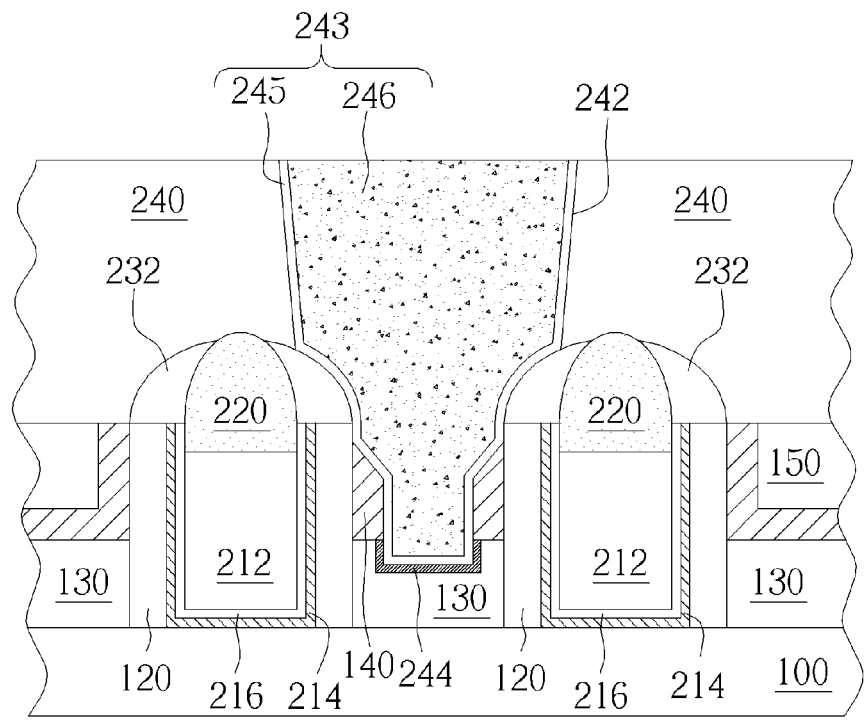

FIG. 7 is a schematic diagram showing a semiconductor device with a contact structure according to a first preferred embodiment of the present invention. A self-aligned silicidation process is carried out to form a metal silicide 244 in the epitaxial layer 130. Afterwards, a self-aligned contact process is performed to sequentially fill a barrier layer 245 and a metal layer 246 into the contact hole 242 so as to form a self-aligned contact structure 243. It should be noted that the self-aligned contact structure 243 may directly contact the patterned mask layer 220b, the spacers 232, the gate spacers 120, the etch stop layer 140, the second interlayer dielectric 240 and the first interlayer dielectric 150, and electrically connect the underneath metal silicide 244, but not limited thereto.

The above-mentioned metal silicide 244 may be a silicide and metal element of the silicide may be selected from the group consisting of tungsten (W), aluminum (Al), copper (Cu), titanium (Ti), tantalum (Ta), niobium (Nb), erbium (Er), molybdenum (Mo), cobalt (Co), nickel (Ni), platinum (Pt) or alloys of which. The self-aligned contact structure 243 may be selected from the group consisting of tungsten (W), aluminum (Al), titanium (Ti), copper (Cu), molybdenum (Mo), cobalt (Co), platinum (Pt) or alloys of which. The barrier layer 245 includes titanium nitride (TiN), tantalum nitride (TaN), Ti/TiN or Ta/TaN, but not limited thereto.

According to the first preferred embodiment, the first mask layers 220 are formed through the oxidation or the nitridation process. Since there is no need to remove an upper portion of the gate electrode 212 and polish the gate electrode 212 during or after the process for forming the first mask layer 220, the difference in height between the initial dummy gate structure 110 and the final metal gate structure 310 may be reduced. In this way, the height of the dummy gate structure 110 at the beginning of the fabrication process may be effectively reduced and the height of the subsequent trench 210 may also be reduced. Accordingly, the drawback of the dummy gate structure 110 being prone to breaking may be overcome; the shadowing effect caused by the dummy gate structure 110 during the ion implantation process may be avoided; the capability of filling the interlayer dielectric layer 150 and the conductive layer respectively into each dummy gate structure 110 and each trench 210 may all be improved. Furthermore, since there is no need to remove the upper portion of the gate electrode 212, even though there are defects, such as void defects, existing in the gate electrode 212, etchants are still not able to reach and damage the structure under the gate electrode 212, such as dielectric layer or substrate, through the defect. This also increases the yield rate of the fabrication process.

Additionally, since the sidewalls of the first mask layer 220 may be optionally further disposed with the second mask layer 232, even though the position of each initial dummy gate structure 110 slightly shifts, or the subsequent first mask layer 220 and/or contact hole 242 is misaligned, the second mask layer 232 may amend this deviation. In this way, the first mask layer 220 along with its second mask layers 232 may completely cover the underneath corresponding gate electrode 212. Accordingly, the non-necessary electrical contact between the self-aligned contact structure 243 and the gate electrode 212 may be avoided.

In the following paragraphs, second and third embodiments of the present invention are further disclosed. For the sake of clarity, only the main difference between each modification and the first preferred embodiment is described, the same or similar processes or structures may refer back to previously described first preferred embodiment.

Figure 8:
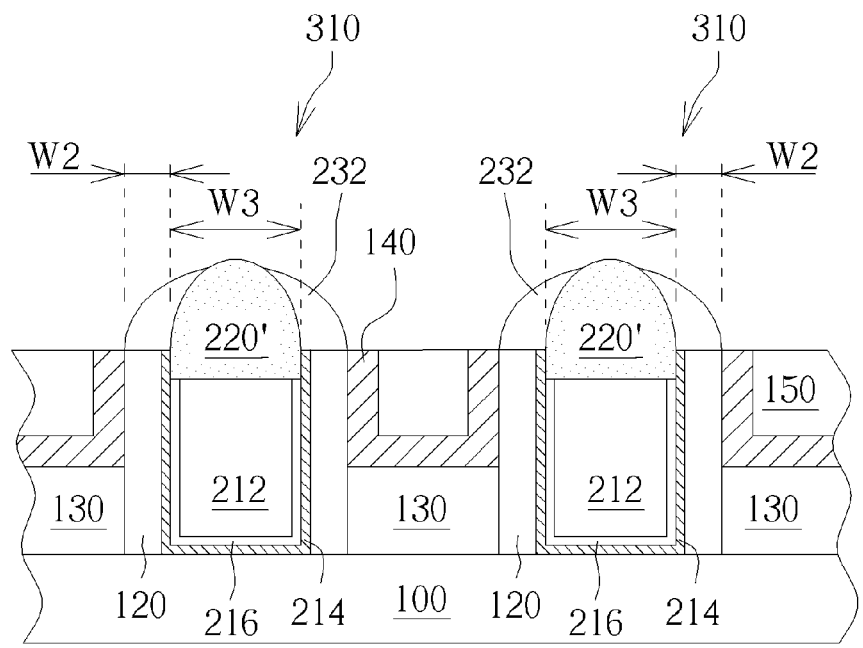

FIG. 8 is schematic cross-sectional diagram showing a semiconductor device according to a second preferred embodiment of the present invention. Processes and structure according to this embodiment are substantially similar to those described in the first preferred embodiment. The main difference between these two embodiments is that the first mask layer 220' of the present embodiment is formed by oxidizing or nitriding the top surfaces of the gate electrode 212 and the work function metal layer 216. In this way, the top surfaces of the gate electrode 212 and the work function metal layer 216 may be completely covered by the first mask layer 220'. Similarly, the bottom surface of the first mask layer 220 may have a third width W3, which is equal to the total width of the gate electrode 212 and the work function metal layer 216. Furthermore, the bottom surface of the second mask layer 232 may have a second width W2, which is less than the third width W3 of the first mask layers 220'. Since other characteristics and advantages of the present modification are all similar to those described in the first preferred embodiment, their description is therefore omitted for the sake of clarity.

Figure 9:
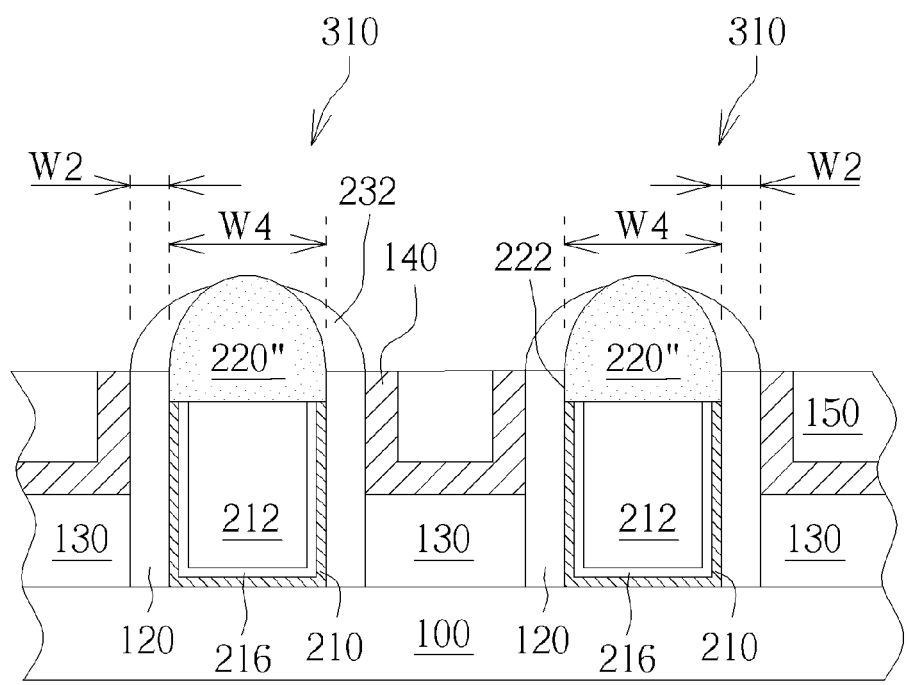

FIG. 9 is schematic cross-sectional diagram showing a semiconductor device according to a third preferred embodiment of the present invention. Processes and structure according to this embodiment are substantially similar to those described in the first preferred embodiment. The main difference between these two embodiments is that the gate electrode 212, the work function metal layer 216 and the dielectric layer 214 in each trench 210 are etched prior to the formation of the first mask layer 220". Therefore, a top recess 22 may be formed in the top portions of the trench 210. Because the step of forming the first mask layer 220" is later than the step of forming the top recess 22, the first mask layer 220" formed by oxidizing or nitriding the top surfaces of the gate electrode 212, the work function metal layer 216 and the dielectric layer 214 may be completely covered by the first mask layer 220". Similarly, the bottom surface of the first mask layer 220" may have a fourth width W4, which is equal to the total width of the gate electrode 212, the work function metal layer 216 and the dielectric layer 214. Furthermore, the bottom surface of the second mask layer 232 may have a second width W2, which is less than the fourth width W4 of the first mask layers 220". Since other characteristics and advantages of the present modification are all similar to those described in the first preferred embodiment, their description is therefore omitted for the sake of clarity.

Although only the transistor device is described in the previous disclosure, it will be apparent that the present invention may be also applied to other types of semiconductor devices without departing from the scope of the present invention. For example, a portion of or all the metal gate structures may be replaced with resistor structures, capacitor structures, e-fused structures or other semiconductor devices. In other words, the self-aligned contact structure does not have to land between two adjacent metal gate structures, it also may land between two adjacent resistor structures or between a resistor structure and a metal gate structure, but not limited thereto.

According to the preferred embodiments, the first mask layer is formed through the oxidation or the nitridation process, and the second mask layer is optionally formed on the sides of the first mask layer. Because there is no need to remove an upper portion of the gate electrode and polish the gate electrode during or after the process for forming the first mask layer, the difference in height between the initial dummy gate structure and the final metal gate structure may be reduced. In this way, the height of the dummy gate structure at the beginning of the fabrication process may be effectively reduced and the height of the subsequent trench may also be reduced. Accordingly, the drawback of the dummy gate structure being prone to breaking may be overcome; the shadowing effect caused by the dummy gate structure during the ion implantation process may be avoided; the capability of filling the interlayer dielectric layer and the conductive layer respectively into each dummy gate structure and each trench may all be improved. Furthermore, since there is no need to remove the upper portion of the gate electrode, even though there are defects, such as void defects, existing in the gate electrode, etchants are still not able to reach and damage the structure under the gate electrode, such as dielectric layer or substrate, through the defect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a gate electrode, disposed on a substrate;
   a first interlayer dielectric, surrounding a periphery of the gate electrode;
   a first mask layer, disposed on the gate electrode, wherein the first mask layer and the gate electrode have at least one same metal component;
   a second mask layer, disposed on sidewalls of the first mask layer; and
   a second interlayer dielectric, disposed on the second mask layer and in direct contact with the first interlayer dielectric.

2. The semiconductor device of claim 1, wherein a top surface of the first mask layer is a convex surface.

3. The semiconductor device of claim 1, wherein a composition of the first mask layer comprises metal compounds.

4. The semiconductor device of claim 1, wherein a top surface of the first mask layer is exposed from the second mask layer.

5. The semiconductor device of claim 1, further comprising:
   a gate spacer, disposed in the first interlayer dielectric and surrounding the gate electrode;
   a work function metal layer, disposed between the gate spacer and the gate electrode; and
   a gate dielectric layer, disposed between the gate spacer and the work function metal layer.

6. The semiconductor device of claim 5, wherein the first mask layer is in direct contact with the work function metal layer.

7. The semiconductor device of claim 5, wherein the first mask layer is in direct contact with the gate dielectric layer.

8. The semiconductor device of claim 5, wherein the second mask layer is in direct contact with the gate spacer.

9. The semiconductor device of claim 5, further comprising a top recess, a bottom surface of the top recess being level with a top surface of the gate electrode.

10. The semiconductor device of claim 1, wherein a composition of the second mask layer is different from a composition of the first mask layer.

11. A method for fabricating a semiconductor device, comprising:
   forming a gate electrode on a substrate, wherein the gate electrode is surrounded by a first interlayer dielectric;
   oxidizing top portions of the gate electrode so as to form a first mask layer;

conformally depositing a dielectric layer covering the first mask layer and the first interlayer dielectric; and etching the dielectric layer so as to form a second mask layer, wherein portions of the first mask layer are exposed from the second mask layer.

12. The method for fabricating a semiconductor device of claim 11, wherein the step of forming the first mask layer comprises an oxidation process.

13. The method for fabricating a semiconductor device of claim 11, wherein a top surface of the first mask layer is a convex surface.

14. The method for fabricating a semiconductor device of claim 11, wherein the second mask layer covers the first mask layer completely when the step of depositing the dielectric layer is completed.

15. The method for fabricating a semiconductor device of claim 11, wherein the first mask layer is exposed from the second mask layer when the step of etching the dielectric layer is completed.

16. The method for fabricating a semiconductor device of claim 11, further comprising depositing a second interlayer dielectric on the second mask layer, wherein the second interlayer dielectric is in direct contact with the first interlayer dielectric.

17. The method for fabricating a semiconductor device of claim 16, further comprising sequentially etching the second interlayer dielectric and the first interlayer dielectric so as to form a contact hole in the first interlayer dielectric and the second interlayer dielectric.

18. The method for fabricating a semiconductor device of claim 11, further comprising:

sequentially depositing a gate dielectric layer, a work function metal layer and the metal electrode, wherein the gate dielectric layer and the work function metal layer are disposed between the gate electrode and the first interlayer dielectric;

etching top portions of the gate dielectric layer, the work function metal layer and the metal electrode so as to form a top recess before forming the first mask layer; and filling up the top recess with the first mask layer during the step of forming the first mask layer.

* * * * *